(12) United States Patent
Wang (10) Patent No.: US 8,971,131 B2
(45) Date of Patent: Mar. 3, 2015

(54) DATA CIRCUIT

(71) Applicant: Bing Wang, Palo Alto, CA (US)

(72) Inventor: Bing Wang, Palo Alto, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/791,258

(22) Filed: Mar. 8, 2013

(65) Prior Publication Data

US 2014/0254289 A1 Sep. 11, 2014

(51) Int. Cl.
*G11C 7/00* (2006.01)
(52) U.S. Cl.
CPC .......................................... *G11C 7/00* (2013.01)
USPC .......... 365/189.011; 365/185.11; 365/185.13; 365/185.05; 365/185.17; 365/189.17; 365/203; 365/204
(58) Field of Classification Search
CPC ...... G11C 16/08; G11C 7/18; G11C 16/0483; G11C 7/22; G11C 7/1051; G11C 7/12; H01L 27/115

USPC ............. 365/185.11, 185.13, 185.05, 185.17, 365/189.011, 189.17, 203, 204
See application file for complete search history.

(56) References Cited

U.S. PATENT DOCUMENTS

| 2014/0071776 A1* | 3/2014 | Chong et al. ................... 365/194 |
| 2014/0126273 A1* | 5/2014 | Behrends et al. ............. 365/154 |
| 2014/0140158 A1* | 5/2014 | Lum et al. ...................... 365/203 |

* cited by examiner

*Primary Examiner* — Fernando Hidalgo
(74) *Attorney, Agent, or Firm* — Lowe Hauptman & Ham, LLP (57) ABSTRACT

A circuit includes a first plurality of memory cells coupled with a first data line and a first data transfer circuit coupled with the first data line and a second data line. In a first operation mode of the circuit, the first data line is left floating and is caused to have a first logical value by a current in at least one memory cell of the first plurality of memory cells. In a second operation mode of the circuit, the first data line is configured to reflect data stored in a memory cell of the plurality of memory cells, and the second data line is configured to reflect the data on the first data line through the first data transfer circuit.

21 Claims, 5 Drawing Sheets

DATA CIRCUIT

FIELD

The present disclosure is related to a data circuit.

BACKGROUND

In some approaches related to a static random access memory (SRAM) cell, a read port of the memory cell generates a high leakage current. For example, at a worst manufacturing process, voltage, and temperature condition, a 72 Kbit macro generates a leakage current of about 9 mA.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. A data transfer circuit is used to transfer data from a memory cell. Compared with another approach, a standby leakage current in some embodiments of the present disclosure is greatly reduced. For example, in a 72 Kbit macro, at a manufacturing process that generates fast N-transistors and fast P-transistors, 125° C., and 110% of typical operating supply voltage VDD, the standby leakage current is reduced by about 60%.

Memory Macro

Figure 1:
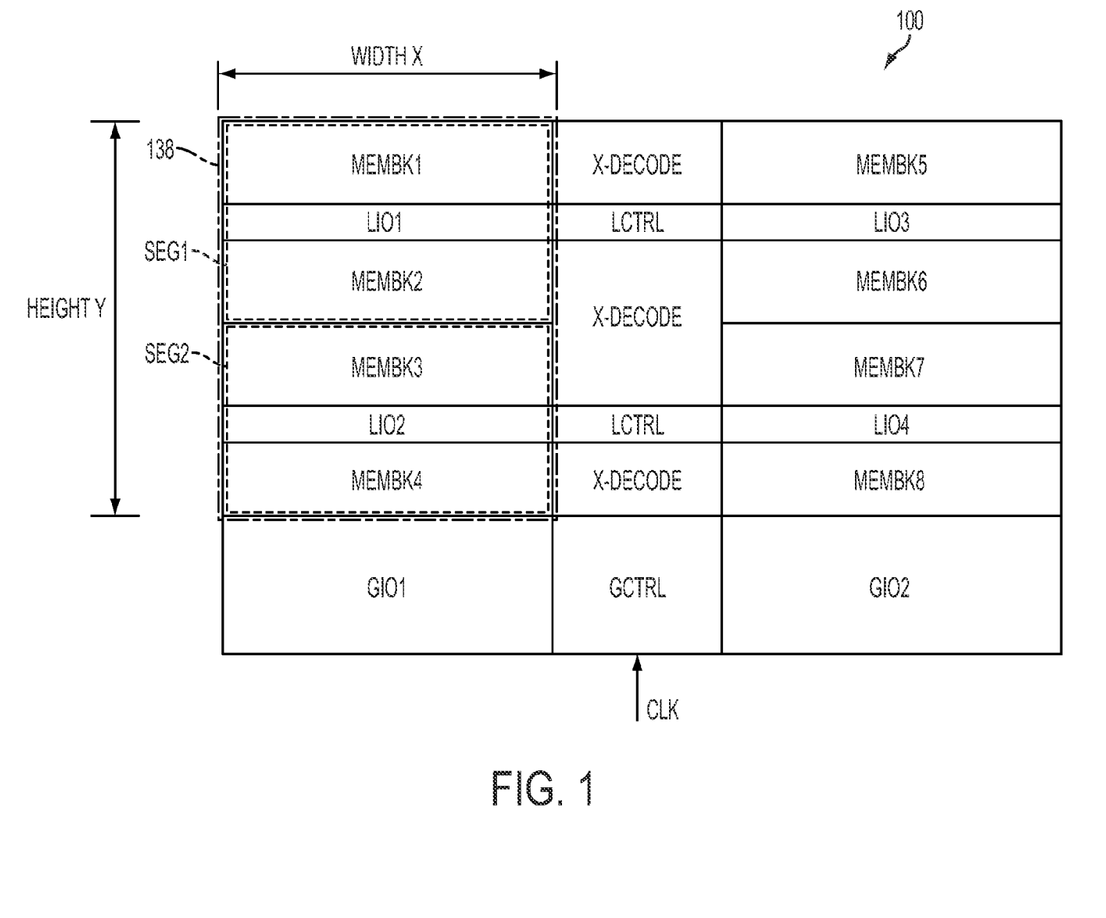
FIG. 1 is a diagram of a memory macro, in accordance with some embodiments.

FIG. 1 is a diagram of a memory macro 100, in accordance with some embodiments. Memory macro 100 is a static random access memory (SRAM) macro, and is used for illustration. Other types of memories are within the scope of various embodiments.

Memory macro 100 is symmetrical. For example, with reference to decoders X-Decode, local control circuits (LCTRLs), or a global control circuit (GCTRL) circuit elements on the left side of memory macro 100 are similar to circuit elements on the right side of memory macro 100. For another example, memory macro 100 includes two memory arrays. One memory array is on the left side of memory macro 100 and one memory array is on the right side of memory macro 100. For illustration, one memory array on the left side of memory macro 100 is labeled memory array 138 that has a width X and a height Y.

Memory array 138 includes a plurality of memory segments. For illustration, two memory segments SEG1 and SEG2 of the memory array on the left of memory macro 100 are shown. Another number of memory segments is within the contemplated scope of the present disclosure.

Each memory segment includes two memory banks. For example, memory segment SEG1 includes two memory banks MEMBK1 and MEMBK2, and memory segment SEG2 includes two memory banks MEMBK3 and MEMBK4. For illustration, only memory segments SEG1 and SEG2 are labeled. Segments including memory banks MEMBK5, MEMBK6, MEMBK7, and MEMBK8 are not labeled.

In a memory segment, two memory banks share a row of a local input-output circuit (LIO). For example, memory bank MEMBK1 and memory bank MEMBK2 share one row of LIOs LIO1. Memory bank MEMBK3 and memory bank MEMBK4 share one row of LIOs LIO2. Memory bank MEMBK5 and memory bank MEMBK6 share one row of LIOs LIO3, and memory bank MEMBK7 and memory bank MEMBK8 share one row of LIOs LIO4.

Memory cells in a memory bank are arranged in rows and columns. As a result, memory cells in a memory segment and in a memory array are also arranged in rows and columns. A memory cell is described with reference to FIG. 2 below, and is labeled MEMCELL. Different configurations of a memory segment are within the contemplated scope of the present disclosure.

A local control LCTRL controls a corresponding LIO.

Global input-output circuits (GIO) GIO1 and GIO2 serve to transfer data between memory cells in a corresponding memory array and other circuits outside of memory macro 100.

Global control GCTRL provides the row address, the column address pre-decode, clock, and other signals for memory macro 100. Global control GCTRL also controls data transfer between memory cells in the memory array and circuits outside of memory macro 100.

Memory Cell

Figure 2:
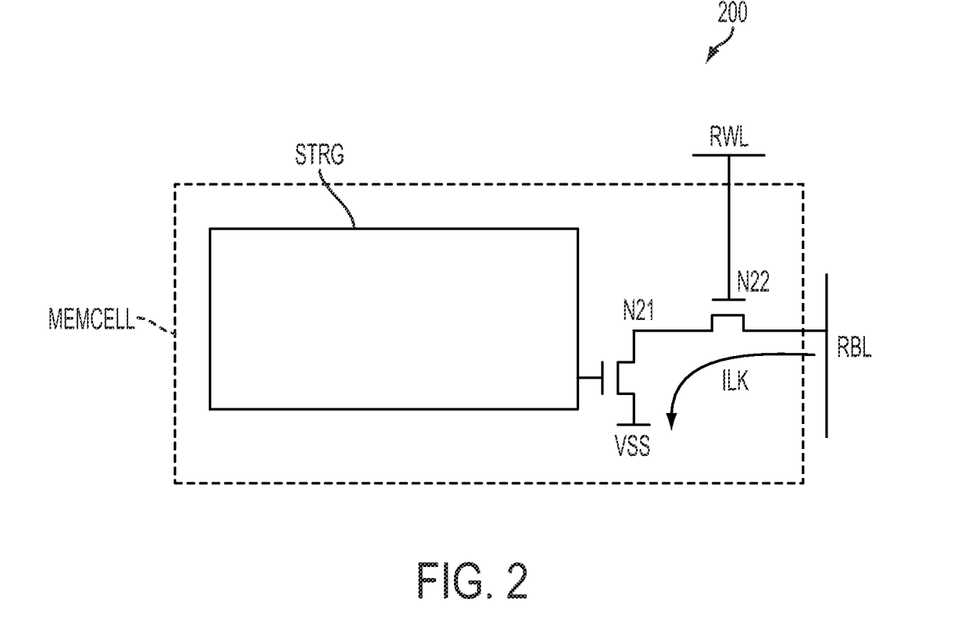
FIG. 2 is a diagram of a memory cell, in accordance with some embodiments.

FIG. 2 is a diagram of a circuit 200, in accordance with some embodiments. Circuit 200 includes a memory cell MEMCELL coupled with a read word line RWL and a read bit line RBL. Read bit line RBL is also call a local read bit line, which is distinguished from a global read bit line GBL1 shown in FIG. 3. Read bit line RBL is also called a data line because read bit line RBL carries data stored in memory cell MEMCELL as explained below.

Memory cell MEMCELL includes a storage unit STRG and a read port that includes two N-type metal oxide semiconductor (NMOS) transistors N21 and N22. In some embodiments, storage unit STRG includes a six-transistor (6-T) cell known in the art. Other types of storage units are within the contemplated scope of the present disclosure.

A gate of transistor N21 receives data from storage unit STRG. A source of transistor N21 receives a supply reference voltage VSS, which, in some embodiments, is ground. A drain of transistor N21 is coupled with a source of transistor N22. A gate of transistor N22 is coupled with read word line RWL. In some embodiments, read word line RWL is coupled with each gate of each transistor N22 in a row of memory cells MEMCELL in a memory bank. A drain of transistor N22 is coupled with read bit line RBL. In some embodiments, read bit line RBL is coupled with each drain of each transistor N22 in a column of memory cells MEMCELL in a memory bank.

When memory cell MEMCELL is accessed for a read operation, detecting a logical value on read bit line RBL reveals the logical data stored in memory MEMCELL. Precharge refers to charging before a read or a write operation. In some embodiments, in a read operation, read bit line RBL is pre-charged with a high logical value. Further, read word line RWL is activated with a high logical value. As a result, transistor N22 is turned on. In some embodiments, when storage unit STRG stores a high logical value, storage unit STRG provides a low logical value to the gate of transistor N21. Consequently, transistor N21 is turned off, and transistors N21 and N22 function as an open circuit. Read bit line RBL therefore remains at the pre-charged high logical value. In other words, the high logical value on read bit line RBL corresponds to the high logical data stored in storage unit STRG.

In contrast, when storage unit STRG stores a low logical value, storage unit STRG provides a high logical value to the gate of transistor N21. As a result, transistor N21 is turned on. Because transistors N21 and N22 are turned on, read bit line RBL is pulled to voltage VSS or a low logical value at the source transistor N21. In other words, the low logical value on read bit line RBL corresponds to the low logical value of the data stored in storage unit STRG. In some embodiments, reading the data on local read bit line RBL is by reading the data on a corresponding global read bit line GBL and is explained below.

Figure 5:
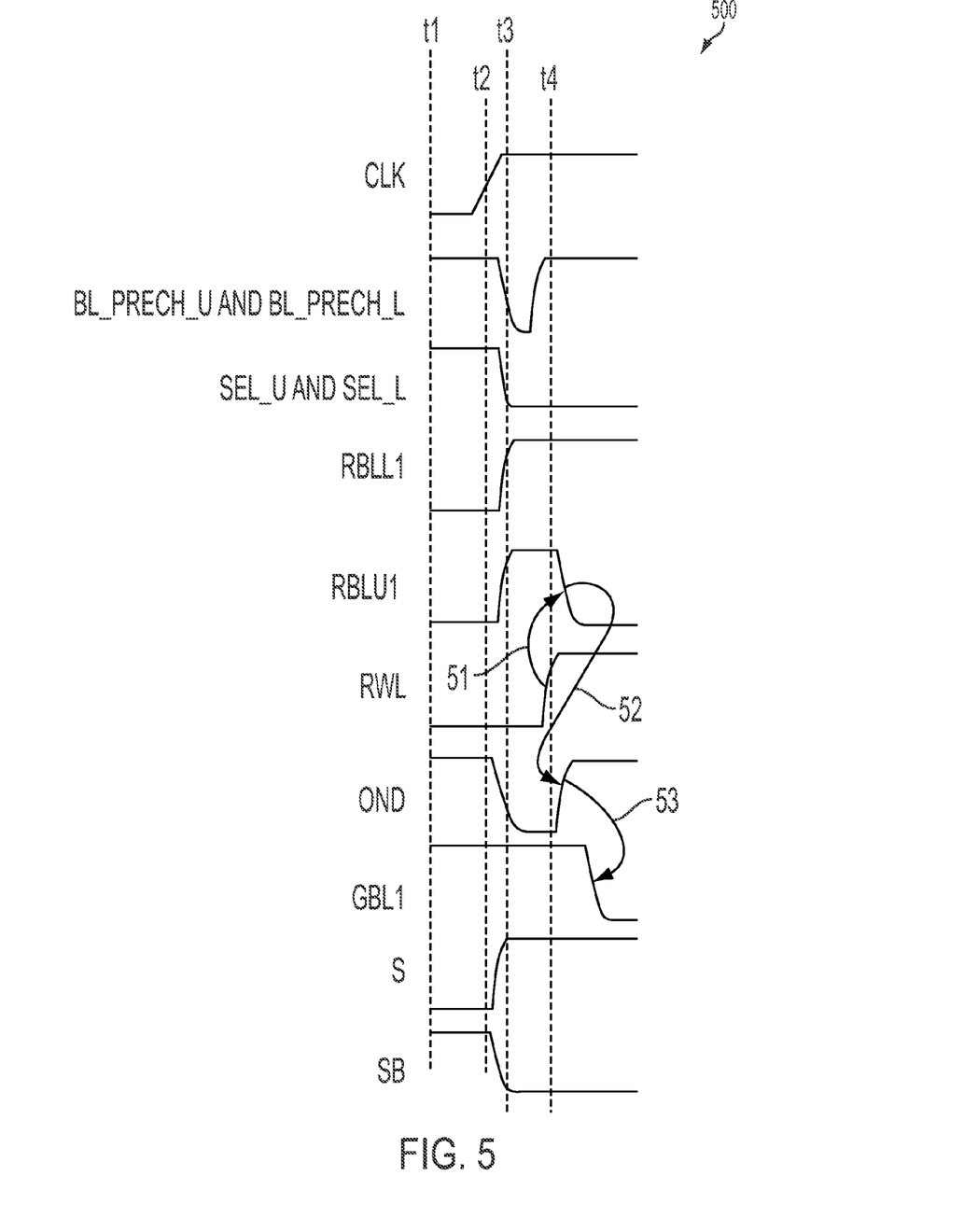
FIG. 5 is a graph of waveforms of various signals of the circuit in FIG. 4, in accordance with some embodiments.

In some embodiments, in a standby mode, such as between a time t1 and a time t2 in FIG. 5, read word line RWL is applied with a low logical value. As a result, transistor N22 is turned off. Whether transistor N21 is on or off depends on the data stored in storage unit STRG. Further, during the standby mode, read bit line RBL is floating. As a result, regardless of whether transistor N1 is turned on or off, a leakage current ILK flows from read bit line RBL through transistors N22 and N21 to the power node that supplies voltage VSS or ground at the source of transistor N21. As a result, read bit line RBL is pulled to ground or a low logical value at the source of transistor N21. As soon as read bit line RBL is at voltage VSS or ground level, leakage current ILK is 0 A. In other words, there is no leakage current. Read bit line RBL remains at the low logical value until read bit line RBL is pre-charged to a high logical value for the next read operation. Effectively, during the standby mode, read bit line RBL remains at the low logical value except for the first time when read bit line RBL is left floating.

Various embodiments of the present disclosure are advantageous over other approaches. For example, in other approaches, in a standby mode read bit line RBL continues to be logically high. As a result, leakage current continues to flow. In a situation where there are thousands of memory cells MEMCELL in a memory macro, such as memory macro 100, such a leakage current is significant in other approaches. In contrast, in various embodiments of the present disclosure, leakage current ILK occurs only once when read bit line RBL is left floating, and stops flowing when read bit line RBL is at the ground level. As a result, compared with other approaches, leakage current ILK in the standby mode in various embodiments of the present disclosure is significantly reduced. For example, in some embodiments, total leakage current ILK in all memory cells MEMCELL of memory macro 100 is reduced by about 60%, compared with the situation in which read bit line RBL continues to be at a high logical value during the standby mode in other approaches.

Memory Array

Figure 3:
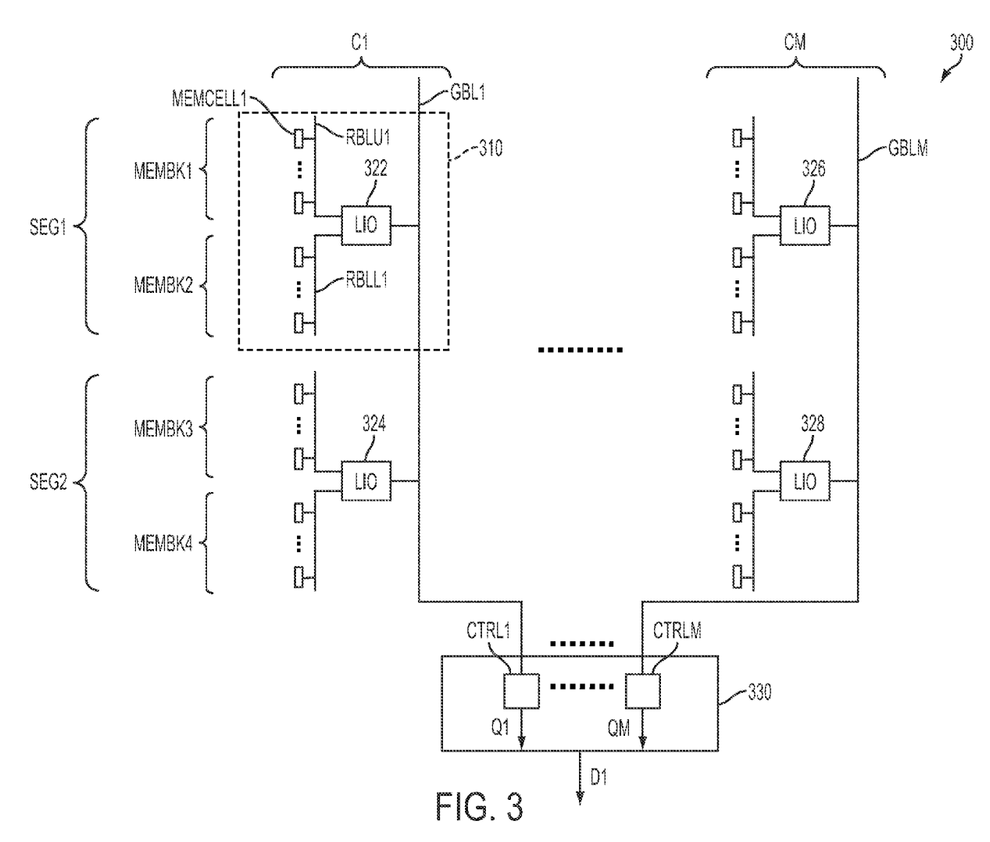
FIG. 3 is a diagram of a circuit for transferring data from a memory cell to a global input-output circuit, in accordance with some embodiments.

FIG. 3 is a diagram of a portion 300 of memory array 138 and GIO1 in FIG. 1, in accordance with some embodiments. Memory array 138 includes a plurality of memory array portions 300.

Memory array portion 300 includes M columns labeled columns C1 to CM, wherein M is an integer number. For illustration, a column C1 to CM is called a column C. Each column C includes a plurality of local input-output circuits (LIOs) corresponding to a plurality of segments. For illustrations, LIOs 322, 324, 326, and 328 are labeled. In FIG. 3, memory array portion 300 includes two segments SEG1 and SEG2. Each of segments SEG1 and SEG2 includes a corresponding LIO in a column C. For example, as illustratively shown, segment SEG1 includes LIO 322 in column C1 and LIO 326 in column CM. Similarly, segment SEG2 includes LIO 324 in column C1 and LIO 328 in column M.

A local input-output circuit (LIO) is coupled with two local read bit lines RBL and a global read bit line GBL. An LIO is also called a data circuit because LIO serves to transfer the data stored in a memory cell MEMCELL to a corresponding global read bit line GBL. For illustration, in FIG. 3, LIO 322 of column C1 is coupled with two local read bit lines RBLU1 and RBLL1 and a global read bit line GBL1. Another number of local read bit lines coupled with LIO 322 or other LIOs is within the contemplated scope of the present disclosure. Each local read bit line RBL is coupled with a plurality of memory cells MEMCELL. For illustration, one memory cell MEMCELL1 to be read is labeled. Memory cell MEMCELL1 is coupled with read bit line RBLU1, which, in turn, is coupled with LIO 322. Circuit connections between memory cell MEMCELL1 with local read bit line RBLU1 are described above with reference to FIG. 2.

Memory cells MEMCELL coupled with the corresponding read bit line RBL belong to a corresponding segment. For example, with reference to a column C1 , memory cells MEMCELL coupled with read bit line RBLU1 of segment SEG1 belong to memory bank MEMBK1 . Memory cells MEMCELL coupled with read bit line RBLL1 of segment SEG1 belong to memory bank MEMBK2 of segment SEG1. Memory cells MEMCELL coupled with two read bit lines of segment SEG2 belong to memory banks MEMBK3 and MEMBK4, etc.

A plurality of global read bit lines GBL1 to GBLM is coupled with a global input-output (GIO) circuit 330 of circuit GIO1 in FIG. 1. When the data stored in a memory cell is read, the data is reflected on a corresponding local read bit line, local input-output circuit, and a global read bit line. The data is then transferred by a corresponding control circuit CTRL1 to CTRLM to a corresponding output Q1 to QM, and is provided on a data line D1 to circuits outside of memory macro 100. In such a condition, when memory array 138 includes N memory portions 300, memory array 130 also includes N data lines from data line D1 to data line DN (not shown), wherein N is integer number. For example, in FIG. 3, when the data stored in memory MEMCELL1 is read, the data is reflected on local read bit line RBLU1, local input-output LIO1, global read bit line GBL1, and is transferred by control circuit CTRL1 to output Q1 and data line D1. For illustration, a global read bit line GBL1 to GBLM is called a global read bit line GBL. In some embodiments, in a read operation of a memory cell MEMCELL, a corresponding global read bit line GBL is pre-charged to a high logical value.

Global input-output (GIO) circuit 330 receives global read bit lines GBL1 to GBLM corresponding to columns C1 to CM. GIO circuit 330 selects one global read bit line GBL1 to GBLM to transfer data on the selected global read bit line as data on a corresponding output Q1 to QM to be read. In some embodiments, data on multiples global read bit lines each from a corresponding circuit GIO 330 of circuit GIO1 is read at the same time. For example, each circuit GIO 330 of the circuit GIO1 selects data on corresponding global read bit line GBL1 of column C1 of N memory portions 300 of memory array 138 for reading. For another example, each circuit GIO 330 of the circuit GIO1 selects data on corresponding global read bit line GBL2 of column C2 of N memory portions 300 of memory array 138 for reading, or each circuit GIO 330 of the circuit GIO1 selects data on corresponding global read bit line GBL3 of column C3 of N memory portions 300 of memory array 138 for reading, etc.

A control circuit CTRL1 to CTRLM is used to transfer the data on a corresponding global read bit line GBL1 to GBLM to an output Q1 to QM, respectively. Each of the data on output Q1 to QM is then selected as data on data line D1.

Memory array portion 300 having two segments SEG1 and SEG2 is for illustration. Another number of segments in a memory array portion 300 is within the contemplated scope of the present disclosure.

Details of a circuit 310 are explained with reference to FIG. 4.

Local IO Circuit

Figure 4:
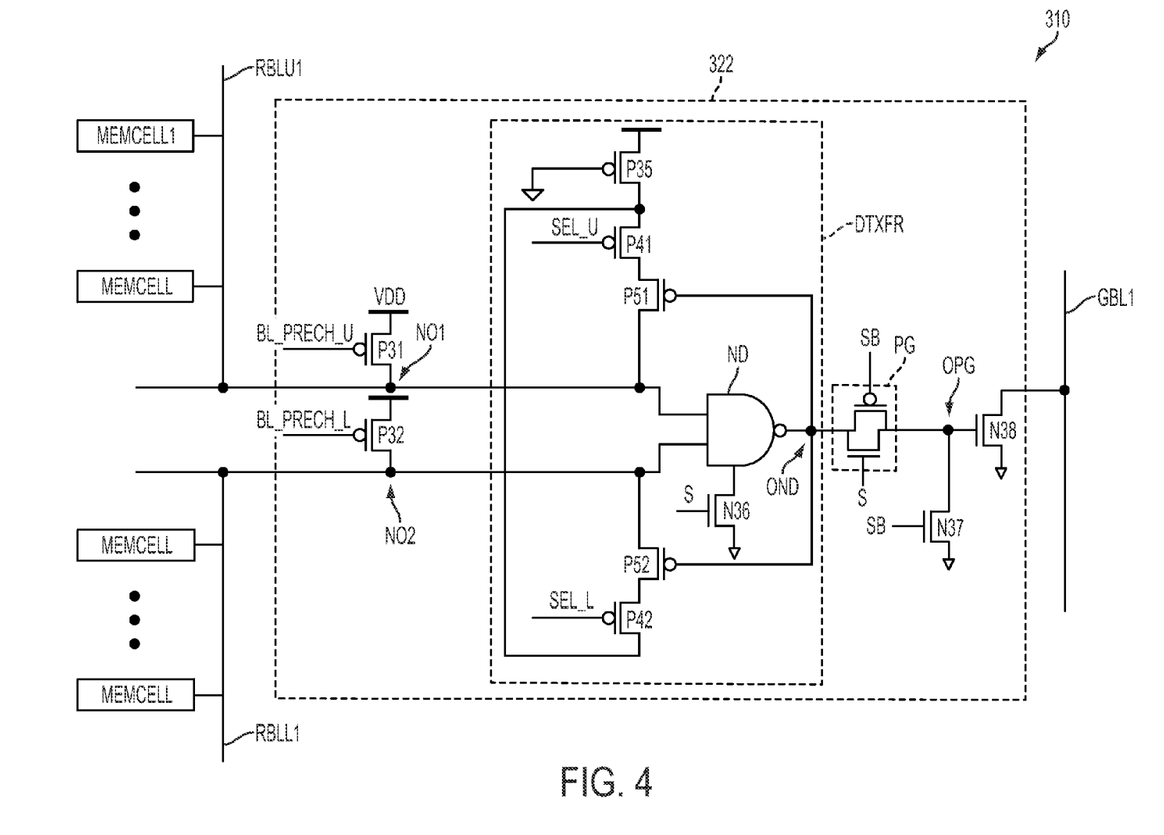
FIG. 4 is a diagram of a circuit for transferring data from a memory cell to a global bit line, in accordance with some embodiments.

FIG. 4 is a diagram of circuit 310 of FIG. 3, in accordance with some embodiments.

With reference to LIO circuit 322, a PMOS transistor P31 is used to pre-charge read bit line RBLU1. For example, when signal BL_PRECH_U is logically low, transistor P31 is turned on. As a result, read bit line RBLU1 is pulled to voltage VDD at a source of transistor P31. In contrast, when signal BL_PRECH_U is logically high, transistor P31 is turned off, and read bit line RBLU1 is electrically disconnected from voltage VDD at a source of transistor P31. In some embodiments, read bit line RBLU1 is then left floating.

A PMOS transistor P32 is used to pre-charge read bit line RBLL1, and operates with read bit line RBLL1 in a manner similar to transistor P31 operating with read bit line RBLU1.

In some embodiments, during a standby mode, signals BL_PRECH_U and BL_PRECH_L are kept at a high logical value. As a result, transistors P31 and P32 are turned off. Read bit lines RBLU1 and RBLL1 are therefore electrically disconnected from voltage VDD at the sources corresponding transistors P31 and P32. In other words, read bit lines RBLU1 and RBLU2 are floating. Because the leakage current from transistors P31 and P32 are insignificant compared with leakage current ILK from memory cells coupled with corresponding read bit lines RBLU1 and RBLU2, read bit lines RBLU1 and RBLU2 are pulled to a low logical value. Effectively, leakage current ILK from the memory cells coupled with read bit lines RBLU1 and RBLU2 is reduced as explained above with reference to FIG. 2.

A data transfer circuit DTXFR transfers the data on node NO1 and/or node NO2 to node OND. For example, when both nodes NO1 and NO2 are logically high, NAND gate ND provides a logical low value to node OND. When either node NO1 or node NO2 is logically low, however, NAND gate ND provides a high logical value to nod OND.

PMOS transistors P35, P41, and P51 are coupled in series. For example a drain of PMOS transistor P35 is coupled with a source of PMOS transistor P41, and a drain of PMOS transistor P41 is coupled with a source of transistor P51. Similarly, PMOS transistors P52 and P42 are coupled in series. For example, a source of PMOS transistor P52 is coupled with a drain of PMOS transistor P42.

A logical value on node OND turns on or off PMOS transistors P51 and P52. For example, when node OND is logically low, both transistors P51 and P52 are turned off. In contrast, when node OND is logically high, both transistors P51 and P52 are turned off.

Signal SEL_U turns on or off PMOS transistor P41. For example, when signal SEL_U is logically low, PMOS transistor P41 is turned on, but when signal SEL_U is logically high, PMOS transistor P41 is turned off. Signal SEL_L turns on or off PMOS transistor P42 in a similar manner as signal SEL_U turning on or off PMOS transistor P41.

NMOS transistor N36 turns on or off NAND gate ND. For example, when signal S is logically low, NMOS transistor N36 is turned off, which, in turn, causes NADN gate ND to be off. In contrast, when signal S is logically high, NMOS transistor N36 is turned on, which, in turn, causes NAND gate ND to turn on. Effectively, NMOS transistor N36 activates or deactivates data transfer circuit DTXFR. For example, if NAND gate ND is off, node OND is electrically disconnected from nodes NO1 and NO2, and data transfer circuit DTXFR is deactivated. But if NAND gate ND is on, data transfer circuit DTXFR is activated and data from node NO1 or node NO2 is transferred to node OND.

Pass gate PG transfers the data on node OND to node OPG. Signal SB is a logical inverse of signal S. When signals S and SB are logically high and low, respectively, pass gate PG is turned on, and the data on node OND is transferred to node OPG. In contrast, when signals S and SB are logically low and high, respectively, pass gate PG is turned off. As a result, node OND is electrically disconnected from node OPG.

NMOS transistor N37 changes the logical value on node OPG. For example, when signal SB at a gate of transistor N37 is logically low, transistor N37 is turned off, the logical value on node OPG is not affected by transistor N37. In contrast, when signal SB is logical high, transistor N37 is turned on. As a result, node OPG is pulled to a low logical value at a source of transistor N37. Because node OPG is coupled with a gate of transistor N38, effectively, transistor N38 is turned on or off by operations of NMOS transistor N37.

NMOS transistor N38 changes the logical value of global read bit line GBL1. For example, when node OPG is logically low, transistor N38 is turned off. Global read bit line GBL1 is not affected by transistor N38. In contrast, when node OPG is logically high, transistor N38 is turned on. As a result, global read bit line GBL1 is pulled to a low logical value at a source of transistor N38.

Each of transistor P31, transistor P32, pass gate PG, transistor N37 or transistor N38 is shown outside of data transfer circuit DTXFR is for illustration. Various embodiments of the disclosure are not limited by a location of transistor P31, transistor P32, pass gate PG, transistor N37 or transistor N38. For example, one or a combination of transistor P31, transistor P32, pass gate PG, transistor N37 or transistor N38 could be part of data transfer circuit DTXFR. Similarly, circuit elements, such as transistor N36, NAND gate ND, etc., could be outside of data transfer circuit DTXFR.

Waveforms

FIG. 5 is a graph of waveforms 500 of various signals in FIG. 4, in accordance with some embodiments. Waveforms 500 are used to illustrate operations of circuit 400. Illustrations with reference to FIG. 5 are explained in the context of memory cell MEMCELL1 of FIG. 4. Details of memory cell MEMCELL1 are explained as memory cell MEMCELL with reference to FIG. 2.

In operation, because a gate of PMOS transistor P35 in FIG. 4 is logically low at ground level, transistor P35 is always on.

Between time a t1 and a time t2 and before clock signal CLK transitions to a high logical value at time t2, memory cell MEMCELL1 and memory macro 100 in FIG. 1 are in a standby mode. Under such a condition, in some embodiments, signals BL_PRECH_U and BL_PRECH_L of FIG. 4 are applied with a high logical value. As a result, transistors P31 and P32 in FIG. 4 are turned off. Read bit lines RBLU1 and RBLL1 are therefore floating. Due to leakage current, such as leakage current ILK in FIG. 2, read bit lines RBLU1 and RBLU2 are pulled to ground or a low logical value as explained above with reference to FIG. 2. As a result, various embodiments of the present disclosure are advantageous over other approaches as also explained with reference to FIG. 2.

Further, signals SEL_U and SEL_L are driven to a high logical value to turn off respective PMOS transistors P41 and P42. Consequently, nodes NO1 and NO2 are electrically disconnected from respective transistors P51 and P52.

Additionally, signal S and signal SB are driven with a respective low and high logical value. Because signal S at a gate of an NMOS transistor N36 is logically low, transistor N36 and NAND gate ND are turned off. Because signals S and SB are logically low and high, respectively, pass gate PG is also off, and node OND is thus electrically disconnected from node OPG. Effectively, node OPG is electrically disconnected from read bit lines RBLU1 and RBLL1.

Because signal SB at a gate of NMOS transistor N37 is logically high, NMOS transistor N37 is turned on. Node OPG at a drain of transistor N37 is therefore pulled to reference voltage VSS or a low logical value at a source of transistor N37. Because node OPG at a gate of NMOS transistor N38 is logically low, transistor N38 is turned off. In various embodiments, global bit line GBL1 is pre-charged to a high logical value. Because transistor N38 is turned off, global bit line GBL1 remains at the pre-charged high logical value.

At time t2, clock signal CLK transitions from a low to a high logical value to start a read operation.

Soon after clock signal CLK transitions to a high logical value at time t2, at a time t3, signals BL_PRECH_U and BL_PRECH_L are driven with a low logical value to turn on respective transistors P31 and P32. A time period between time t2 and time t3 is predetermined, depending a particular design of memory cell MEMCELL1. Further, in some embodiments, signals BL_PRECH_U and BL_PRECH_L pulse as shown. A width of the pulse is predetermined sufficiently to pre-charge read bit lines RBLU1 and RBLL1. During the time signals BL_PRECH_U and BL_PRECH_L are logically low, transistors P31 and P32 are turned on, and read bit lines RBLU1 and RBLL1 are pulled to a high logical value at the sources of respective transistors P31 and P32.

At time t3, signals SEL_U and SEL_L are also driven to a low logical value to turn on respective transistors P41 and P42. Signals S and SB are driven with a high and a low logical value, respectively. Because signal S at the gate of NMOS transistor N36 is logically high, NMOS transistor N36 and NAND gate ND are turned on. Because node NO1 or read bit line RBLU1 and node NO2 or read bit line RBLL1 are logically high, node OND at an output of NAND gate ND is logically low by operations of NAND gate ND. Because node OND at gates of PMOS transistors P51 and P52 are logically low, PMOS transistors P51 and P52 are turned on. Because transistors P35, P41, P51, P52, and P42 are on, node NO1 coupled with read bit line RBLU1 and node NO2 coupled with read bit line RBLL1 are puled to voltage VDD at a source of transistor P35. Effectively, read bit lines RBLU1 and RBLL1 are logically high even after signals BL_PRECH_U and BL_PRECH_L have turned to a high logical value after pulsing.

Further, because signal SB at the gate of NMOS transistor N37 is logically low, NMOS transistor N37 is turned off. Because signals S and SB at terminals of pass gate PG are logically high and low, respectively, pass gate PG is turned on. As a result, the low logical value on node OND is transferred to node OPG. Because node OPG is logically low, transistor N38 continues to be off and global bit line GBL1 continues to be logically high at the pre-charged level.

At a time t4, read word line RWL is driven with a high logical value for the data stored in storage unit STRG of memory cell MEMCELL1 to be transferred to the gate of transistor N21 as explained with reference to FIG. 2. For illustration, the data stored in memory cell MEMCELL1 is logically low, and the data at the gate of transistor N21 is therefore logically high. As a result, transistor N21 is turned on. Because transistor N22 and transistor N21 are turned on, transistors N22 and N21 pull read bit line RBLU1 towards a low logical value, as indicated by arrow 51. Read bit line RBLL1 remains at the high logical value.

Because read bit line RBLU1 is logically low, by operations of NAND gate ND, node OND transitions to a high logical value as indicated by arrow 52. Because signal SB at the gate of transistor N37 is logically low, transistor N37 is turned off. Because pass gate PG is turned on, the logical high value on node OND is transferred to node OPG. Because transistor N37 is turned off, and node OPG at the gate of NMOS transistor N38 is logically high, NMOS transistor N38 is turned on. As a result, global read bit line GBL1 is pulled to a low logical value at the source of transistor N38, as indicated by arrow 53. Effectively, the low logical value on global read bit line GBL1 reflects the low logical value on local read bit line RBLU1. Detecting a logical value on global read bit line GBL1 reveals the data on local read bit line RBLU1 that is also the data stored in memory cell MEMCELL1.

At time t4, if the data stored in memory cell MEMCELL1 is logically high, read bit line RBLU1 continues to be logically high as read bit line RBLL1. As a result, node OND continues to be logically low, node OPG continues to be logically low, transistor N38 continues to be turned off, and global read bit line GBL1 continues to be logically high at the pre-charged level. Effectively, the pre-charged high logical value of global bit line GBL1 reflects the high logical value of read bit line RBLU1, which is also the data stored in memory cell MEMCELL1.

In the above illustration, operations on memory cell MEMCELL1 are for illustrations. Operations on other memory cells coupled with read bit line RBLU1 are similar. Further, operations on a memory cell coupled with read bit line RBLL1 with reference to node NO2 and PMOS transistor P32 are similar with operations on a memory cell coupled with read bit line RBLU1 with reference to node NO1 and PMOS transistor P31. Additionally, operations on a memory cell of another column are similar with operations on a memory cell of column C1 as explained above. Explanation of LIO circuit 322 is used for illustration. Operations of other LIO circuits are similar to those of LIO circuit 322.

In some embodiments, a circuit includes a first plurality of memory cells coupled with a first data line and a first data transfer circuit coupled with the first data line and a second data line. In a first operation mode of the circuit, the first data line is left floating and is caused to have a first logical value by a current in at least one memory cell of the first plurality of memory cells. In a second operation mode of the circuit, the first data line is configured to reflect data stored in a memory cell of the plurality of memory cells, and the second data line is configured to reflect the data on the first data line through the first data transfer circuit.

In some embodiments, a method is based on a circuit having a data line coupled with a plurality of memory cells and a charging circuit. In a first operation mode of the circuit, the charging circuit is electrically disconnected from the data line to float the data line, and, based on a current between the data line and the plurality of memory cells, the data line is caused to have a first logical value. In a second operation mode of the circuit, the charging circuit causes the data line to have a second logical value different from the first logical value.

In some embodiments, a circuit comprises a first plurality of memory cells coupled with a first data line, a second plurality of memory cells coupled with a second data line, a first data transfer circuit, a second data transfer circuit, a first transistor, a second transistor, and a third data line. A first input of the first data transfer circuit is coupled with the first data line. A second input of the first data transfer circuit is coupled with the second data line. An output of the first data transfer circuit is coupled with an input of the second data transfer circuit. An output of the second data transfer circuit is coupled with the first transistor and the second transistor. The second transistor is coupled with the third data line.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a first plurality of memory cells coupled with a first data line; and
a sub-circuit coupled with the first data line and a second data line,
wherein
in a first operation mode of the circuit in which the first plurality of memory cells is in a standby mode, the first data line is configured to be floating and has a set of leakage paths associated thereto toward a reference voltage, and the first data line is caused to have a first logical value through one or more of the set of leakage paths in at least one memory cell of the first plurality of memory cells; and
in a second operation mode of the circuit in which the first plurality of memory cells is in a read mode, the first data line is configured to reflect data stored in a memory cell of the plurality of memory cells, and the second data line is configured to reflect the data on the first data line through the sub-circuit.

2. The circuit of claim 1 further comprising
a third data line coupled with a second plurality of memory cells and with the sub-circuit,
wherein
in the first operation mode in which the second plurality of memory cells is in the standby mode, the third data line is configured to be floating and has another set of leakage paths associated thereto, and the third data line is pulled to the first logical value through one or more of the another set of leakage paths in at least one memory cell of the second plurality of memory cells.

3. The circuit of claim 1 further comprising a charging circuit coupled with the first data line and with the sub-circuit,
wherein
in the first operation mode, the charging circuit is configured to electrically disconnect a charging voltage from the first data line; and
in the second operation mode, the charging circuit is configured to electrically connect the charging voltage with the first data line such that the first data line is caused to have a second logical value different from the first logical value.

4. The circuit of claim 3, wherein
the charging circuit includes a PMOS transistor; and
in the second operation mode, a gate of the PMOS transistor is configured to receive a pulsed signal.

5. The circuit of claim 1, wherein
the sub-circuit includes a logic gate, a pass gate, a first NMOS transistor, and a second NMOS transistor;
the first data line is coupled with an input of the logic gate;
an output of the logic gate is coupled with an input of the pass gate;
an output of the pass gate is coupled with the first NMOS transistor and with the second NMOS transistor; and
the second data line is coupled with a drain of the second NMOS transistor.

6. The circuit of claim 5, wherein
the logic gate is a NAND gate;
the sub-circuit further comprises a first PMOS transistor, a second PMOS transistor, a third PMOS transistor, a fourth PMOS transistor, and a fifth PMOS transistor;
the first PMOS transistor, the second PMOS transistor, and the third PMOS transistor are coupled in series;
a drain of the third PMOS transistor is coupled with a first input of the NAND gate;
a drain of the fourth PMOS transistor is coupled with a second input of the NAND gate;
an output of the NAND gate is coupled with a gate of the third PMOS transistor and with a gate of the fourth PMOS transistor;
the fourth PMOS transistor and the fifth PMOS transistor are coupled in series; and
a source of the fifth PMOS transistor is coupled with a drain of the first PMOS transistor and with a source of the second PMOS transistor.

7. The circuit of claim 1, wherein
the sub-circuit includes a first data transfer circuit having a first NMOS transistor, a second data transfer circuit, a second NMOS transistor, and a third NMOS transistor;
the first NMOS transistor is configured to activate and deactivate the first data transfer circuit based on a first control signal;
the second data transfer circuit is coupled with the first data transfer circuit, the second NMOS transistor, and the third NMOS transistor, and is configured to be activated or deactivated by the first control signal and a second control signal, wherein the second control signal is a logical inverse of the first control signal;
the second NMOS transistor is configured to be activated or deactivated by the second control signal; and
the third NMOS transistor is coupled with the second data line and is configured to be activated or deactivated by an operation of the second NMOS transistor based on the second control signal.

8. The circuit of claim 1, wherein
a memory cell of the plurality of memory cells includes a first transistor and a second transistor;
a gate of the first transistor is coupled with the memory cell;
a drain of the first transistor is coupled with a source of the second transistor; and
a drain of the second transistor is coupled with the first data line.

9. A method comprising:
based on a circuit having a data line coupled with a plurality of memory cells and a charging circuit,
during a first time period in which the plurality of memory cells is in a standby mode:
electrically disconnecting the charging circuit from the data line; and
based on a leakage current from the data line through one or more of the plurality of memory cells, causing the data line to have a first logical value; and
during a second time period in which the plurality of memory cells is in a read mode:
the charging circuit causing the data line to have a second logical value different from the first logical value.

10. The method of claim 9, wherein
the charging circuit includes
a PMOS transistor having a source receiving a supply voltage of the second logical value,
a drain coupled with the data line, and
a gate receiving a control signal.

11. The method of claim 10, wherein
during the second time period, the control signal includes a pulse.

12. The method of claim 9, wherein
a memory cell of the plurality of memory cells includes a first transistor and a second transistor;
a gate of the first transistor is coupled with the memory cell;
a drain of the first transistor is coupled with a source of the second transistor; and
a drain of the second transistor is coupled with the data line.

13. The method of claim 9, wherein
the data line is coupled with a first data transfer circuit;
a first NMOS transistor of the first data transfer circuit is configured to activate and deactivate the first data transfer circuit based on a first control signal;
a second data transfer circuit is coupled with the first data transfer circuit, a second NMOS transistor, and a third NMOS transistor, and is configured to be activated or deactivated by the first control signal and a second control signal, wherein the second control signal is a logical inverse of the first control signal;
the second NMOS transistor is configured to be activated or deactivated by the second control signal; and
the third NMOS transistor is coupled with a second data line and is configured to be activated or deactivated by an operation of the second transistor NMOS based on the second control signal.

14. A circuit comprising:
a first plurality of memory cells coupled with a first data line;
a second plurality of memory cells coupled with a second data line;
a first data transfer circuit;
a second data transfer circuit, the first data transfer circuit and the second data transfer circuit having different configurations;
a first transistor;
a second transistor; and
a third data line,
wherein
a first input of the first data transfer circuit is coupled with the first data line;
a second input of the first data transfer circuit is coupled with the second data line;
an output of the first data transfer circuit is coupled with an input of the second data transfer circuit;
an output of the second data transfer circuit is coupled with a drain of the first transistor and a gate of the second transistor; and
a drain of the second transistor is coupled with the third data line.

15. The circuit of claim 14 further comprising
a first charging circuit coupled with the first data line; and
a second charging circuit coupled with the second data line.

16. The circuit of claim 14 further comprising a first PMOS transistor and a second PMOS transistor, wherein
a source of the first PMOS transistor is configured to receive a supply voltage;
a gate of the first PMOS transistor is configured to receive a first control signal;
a drain of the first PMOS transistor is coupled with the first data line;
a source of the second PMOS transistor is configured to receive the supply voltage;
a gate of the second PMOS transistor is configured to receive a second control signal;
a drain of the second PMOS transistor is coupled with the second data line.

17. The circuit of claim 14, wherein
the first data transfer circuit comprises a NAND gate, a first PMOS transistor, a second PMOS transistor, a third PMOS transistor, a fourth PMOS transistor, and a fifth PMOS transistor;
the first PMOS transistor, the second PMOS transistor, and the third PMOS transistor are coupled in series;
a drain of the third PMOS transistor is coupled with a first input of the NAND gate;
a drain of the fourth PMOS transistor is coupled with a second input of the NAND gate;
an output of the NAND gate is coupled with a gate of the third PMOS transistor and with a gate of the fourth PMOS transistor;
the fourth PMOS transistor and the fifth PMOS transistor are coupled in series; and a source of the fifth PMOS transistor is coupled with a drain of the first PMOS transistor and with a source of the second PMOS transistor.

18. The circuit of claim 14, wherein
the first data transfer circuit includes an NMOS transistor;
the NMOS transistor is configured to activate and deactivate the first data transfer circuit based on a first control signal;
the second data transfer circuit is configured to be activated or deactivated by the first control signal and a second control signal, wherein the second control signal is a logical inverse of the first control signal;
the first transistor is an N-type transistor and is configured to be activated or deactivated by the second control signal;
the second transistor is an N-type transistor and is configured to be activated or deactivated by an operation of the first transistor based on the second control signal.

19. The circuit of claim 14, wherein
the second data transfer circuit includes a pass gate;
the first transistor is an N-type transistor; and
the second transistor is an N-type transistor.

20. The circuit of claim 14, wherein
a memory cell of first the plurality of memory cells or of the second plurality of memory cells includes a first read-port transistor and a second read-port transistor;
a gate of the first read-port transistor is coupled with the memory cell;
a drain of the first read-port transistor is coupled with a source of the second read-port transistor; and
a drain of the second read-port transistor is coupled with the first data line or with the second data line.

21. The circuit of claim 14, wherein
in a first operation mode of the circuit in which the first plurality of memory cells is in a standby mode,
the first data line is configured to be floating and has a set of leakage paths associated thereto, and the first data line is caused to have a first logical value through one or more of the set of leakage paths in at least one memory cell of a first plurality of memory cells, and
the second data line is configured to be floating and has another set of leakage paths associated thereto, and the second data line is caused to have the first logical value through one or more of the another set of leakage paths in at least one memory cell of the second plurality of memory cells; and
in a second operation mode of the circuit in which the first plurality of memory cells is in a read mode,
at least one of the first data line or the second data line is configured to reflect data stored in a memory cell of the first plurality of memory cells or a memory cell of the second plurality of memory cells, and
the third data line is configured to reflect the data on the first data line or the data on the second data line through the first data transfer circuit and the second data transfer circuit.

\* \* \* \* \*